US012581751B2

(12) United States Patent
Masselink et al.

(10) Patent No.: US 12,581,751 B2
(45) Date of Patent: Mar. 17, 2026

(54) PHOTOCONDUCTOR AND METHOD FOR PRODUCING SAME

(71) Applicants: HUMBOLDT-UNIVERSITÄT ZU BERLIN, Berlin (DE); FRAUNHOFER-GESELLSCHAFT ZUR FÖRDERUNG DERANGEWANDTEN FORSCHUNG E.V., Munich (DE)

(72) Inventors: William Ted Masselink, Berlin (DE); Mykhaylo Petrovych Semtsiv, Berlin (DE); Björn Globisch, Berlin (DE)

(73) Assignees: HUMBOLDT-UNIVERSITÄT ZU BERLIN, Berlin (DE); FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 18/035,725

(22) PCT Filed: Oct. 22, 2021

(86) PCT No.: PCT/DE2021/200163
§ 371 (c)(1),
(2) Date: May 5, 2023

(87) PCT Pub. No.: WO2022/096071
PCT Pub. Date: May 12, 2022

(65) Prior Publication Data
US 2023/0411548 A1      Dec. 21, 2023

(30) Foreign Application Priority Data
Nov. 6, 2020     (DE) ..................... 10 2020 213 957.1

(51) Int. Cl.
*H10F 30/10*          (2025.01)
*H10F 71/00*          (2025.01)
(Continued)

(52) U.S. Cl.
CPC ......... *H10F 30/10* (2025.01); *H10F 71/1272* (2025.01); *H10F 77/1243* (2025.01); *H10F 77/1248* (2025.01); *H10F 77/1468* (2025.01)

(58) Field of Classification Search
CPC .. H10F 30/10; H10F 71/1272; H10F 77/1243; H10F 77/1468; H10F 77/1248
See application file for complete search history.

(56) References Cited

U.S. PATENT DOCUMENTS

| | | | |
|---|---|---|---|
| 4,882,609 A | 11/1989 | Schubert et al. | |
| 5,060,234 A | 10/1991 | Schubert et al. | |
(Continued)

FOREIGN PATENT DOCUMENTS

| | | |
|---|---|---|
| DE | 10 2006 014 801 A1 | 10/2007 |
| DE | 10 2008 023 991 A1 | 12/2009 |
(Continued)

OTHER PUBLICATIONS

Anatoly A. Ignatov, "Semiconductor Superlattice Diodes for Detection of THz Photons: The Role of Plasmon Polariton Excitation"; 20 pages.
(Continued)

*Primary Examiner* — Tae-Sik Kang
(74) *Attorney, Agent, or Firm* — Gordon Rees Scully & Mansukhani, LLP

(57) ABSTRACT
The invention relates inter alia to a photoconductor (10) comprising a multilayer (13) which comprises a plurality of photoconductive semiconductor layers (131-134). According to the invention, the multilayer (13) comprises at least two sublayers (130) which each comprise at least a first
(Continued)

Figure 1:
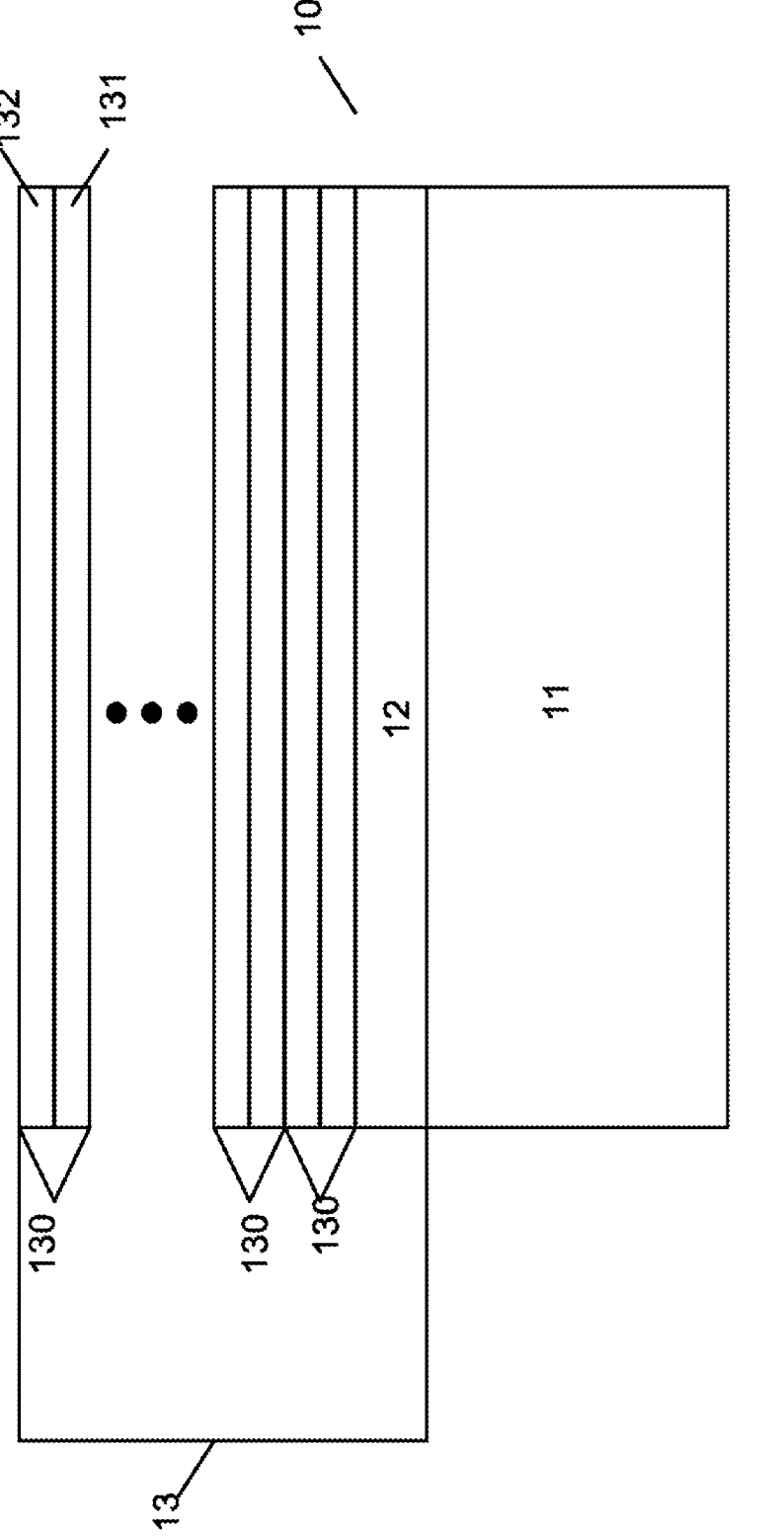

photoconductive semiconductor layer (131) and a second photoconductive semiconductor layer (132), wherein the first and the second photoconductive semiconductor layer (131, 132) are doped to different degrees for each of the sublayers (130).

15 Claims, 4 Drawing Sheets

(51) Int. Cl.
    *H10F 77/124*          (2025.01)
    *H10F 77/14*           (2025.01)

(56) References Cited

U.S. PATENT DOCUMENTS

| | | | |
|---|---|---|---|
| 5,132,763 A * | 7/1992 | Maserjian | ............... H10F 30/10 |
| | | | 257/E31.093 |
| 5,319,657 A | 6/1994 | Otsuka et al. | |
| 7,642,205 B2 | 1/2010 | Timans | |
| 2004/0033637 A1 | 2/2004 | Johnson | |
| 2011/0080329 A1 | 4/2011 | Nagel | |
| 2012/0236307 A1 | 9/2012 | Sekiquchi | |
| 2019/0035625 A1 * | 1/2019 | Dietz | ............... H01L 21/02581 |

FOREIGN PATENT DOCUMENTS

| | | | | |
|---|---|---|---|---|
| DE | 10 2016 202 216 A1 | 8/2017 | | |
| JP | S 61-166081 A | 7/1986 | | |
| JP | S 63-278283 A | 11/1988 | | |
| JP | 2012-212870 A | 11/2012 | | |
| JP | 2019-508895 A | 3/2019 | | |
| WO | 2011/007185 A1 | 1/2011 | | |
| WO | WO-2017137589 A1 * | 8/2017 | ........... | C30B 23/063 |

OTHER PUBLICATIONS

Vadim E. Tokranov,et al.; "QD VCSELs with InAs/InGaAs Short; Period Superlattice QW Injector"; Quantum Dots, Particles, and Nanoclusters VI; Proc. of SPIE; vol. 7224; 72240T-1; (2009); 9 pages.

K. Ohmori, et al.; "Much Improved Self-Organized In0.53Ga0.47As Quantum Wire Lasers Grown on (775)B InP Substrates by Molecular Beam Epitaxy"; Institute of Physics Publishing; Journal of Physics: Conference Series 38 (2006); pp. 99-103.

German Office Action dated Apr. 30, 2021 issued by the German Patent Office in related German Patent Application No. 10 2020 213 957.1; filed Nov. 6, 2020.

R.B. Kohlhaas, et al.; "Rhodium Doped InGaAs: A Superior Ultrafast Photoconductor"; Applied Physics Letters vol. 112; 102101; (2018); 5 pages.

D.C. Driscoll, et al.; "Carrier Compensation in Semiconductors with Buried Metallic Nanoparticles"; Journal of Applied Physics; vol. 97; 016102 (2005); 4 pages.

A. Schwagmann, et al.; "Terahertz Emission Characteristics of ErAs:InGaAs-based Photoconductive Antennas Excited at 1.55 um"; Applied Physics Letter; vol. 96; 141108; (2010); 4 pages.

M. Guezo, et al.; "Ultrashort, nonlinear, optical time response of Fe-doped InGaAs/InP multiple quantum wells in 1.55 um range"; Applied Physics Letters; vol. 82, No. 11; Mar. 17, 2003; XP012033512; pp. 1670-1672.

W. Jantsch, et al.; "Photoconductive Response of PbTe Doping Superlattices"; Applied Physics Letters; vol. 50; 1654 (1987); 4 pages.

D.L. Partin, et al.; "Bismuth-and Thallium-Doped Lead Telluride Grown by Molecular-Beam Epitaxy"; Journal of Applied Physics; vol. 66; (1989); pp. 6116-6120.

D. Landheer, et al.; "Enhancement of Carrier Lifetime in Silicon-Doping Superlattices"; Applied Physics Letters; vol. 52; (1988); pp. 910-912.

International Search Report dated Jan. 25, 2022 issued in related International Patent Application No. PCT/DE2021/200161; filed Oct. 22, 2021.

Robert B. Kohlhaas, et al.; "70 dB Signal-to-Noice Ratio at 3 THz Using Locally Doped InGaAs-Based Photoconductive Detectors"; 42nd International Conference on Infrared, Millimeter and Terahertz Waves; Aug. 27, 2017; XP033165132; pp. 1-2.

B. Globisch, et al.; "Iron doped InGaAs: Competitive THz emitters and detectors fabricated from the same photoconductor"; Journal of Applied Physics; vol. 121, 053102 (2017); 13 pages.

B. Sartorius, et al.; "All-Fiber Terahertz Time-Domain Spectrometer Operating at 1.5 [um]m Telecom Wavelenghts"; Optics Express; vol. 16; No. 13; (2008); pp. 9565-9570.

Office Action (Notice of Reasons for Refusal) dated Nov. 18, 2025 issued by the Japan Patent Office in related Japanese Patent Application No. 2023-528010.

* cited by examiner

PHOTOCONDUCTOR AND METHOD FOR PRODUCING SAME

The invention relates to a photoconductor having a layer package comprising a plurality of photoconductive semiconductor layers. Such a photoconductor is known from the German unexamined patent application DE 102016 202 216 A1.

Photoconductors can be used, for example, in combination with suitable antennas for receiving and/or transmitting electromagnetic radiation in the terahertz range, for example in the range between 0.1 and 10 THz.

The object of the invention is to specify a photoconductor with a layer package that is optimized with respect to its photoconductive properties.

This object is achieved according to the invention by a photoconductor having the features of patent claim 1. Advantageous embodiments of the photoconductor according to the invention are specified in the dependent claims.

According to the invention, it is provided that the layer package comprises at least two sub-packages, each comprising at least one first photoconductive semiconductor layer and a second photoconductive semiconductor layer, wherein in each of the sub-packages the first and second photoconductive semiconductor layer are doped to different degrees.

An essential advantage of the photoconductor according to the invention is that an individual optimization of the physical properties of the two semiconductor layers can be achieved by the different configuration of the semiconductor layers with regard to the doping. For example, it is possible to target the provision of recombination centers in the higher-doped layer, which enable electrons and holes to recombine and thus support the photoconductive action of the photoconductor. The other photoconductive semiconductor layer of each sub-package may have a different function, for example, to reduce the background conductivity and to compensate for or reduce the generation of dark currents.

With regard to individual optimization of the semiconductor layers, it is advantageous if in each of the sub-packages the first photoconductive semiconductor layer is doped at least 10 times higher, particularly preferably at least 100 times higher, than the second photoconductive semiconductor layer.

The dopant with which the first and/or second photoconductive semiconductor layer of each sub-package are differently doped is preferably a transition metal, for example iron, ruthenium, rhodium or iridium.

It is also considered advantageous if in each of the sub-packages the dopant in the first photoconductive semiconductor layer forms a higher concentration of dopant clusters than in the second photoconductive semiconductor layer and if the dopant distribution in the second photoconductive semiconductor layer is homogeneous, at least more homogeneous than in the first photoconductive semiconductor layer.

Alternatively or in addition, it may be advantageously provided that in each of the sub-packages, due to the different doping, the first photoconductive semiconductor layer has a greater recombination rate for electron-hole pairs than the second photoconductive semiconductor layer and that in each of the sub-packages, due to the different doping, the second photoconductive semiconductor layer has a greater electrical resistance than the first photoconductive semiconductor layer.

The thickness of each of the semiconductor layers of each sub-package is preferably less than 10 nm.

The thickness of the layer package formed from the sub-packages is preferably in a range between 0.5 and 2 μm.

The number of sub-packages in the layer package is preferably between 20 and 100.

The thickness of the first and second photoconductive semiconductor layer in each sub-package is preferably on the order of magnitude of the de-Broglie wavelength of electrons that are located in the respective semiconductor layer and mobile in the respective layer plane.

The probability distribution of electrons in each sub-package—viewed perpendicular to the layer plane of the semiconductor layers—extends at least over the first and second semiconductor layer.

The described configuration of the layer thicknesses and the electron probability distribution based on it facilitates the ability of properties of layers to affect neighboring layers, for example dark currents, which could be induced by the first semiconductor layers, are compensated by the second semiconductor layers. In a preferred embodiment, it is provided that in at least one of the sub-packages or in all sub-packages, an intermediate layer is arranged between the first and second semiconductor layer, which slows down the diffusion of the dopant from the first into the second semiconductor layer.

The first and second semiconductor layers are preferably each doped InGaAs layers.

The dopant or dopants with which the first and second semiconductor layers are doped are preferably iron, rhodium and/or ruthenium.

The first and second semiconductor layers are preferably each molecular beam epitaxy-grown layers.

In a preferred embodiment the dopant, with which the first and second photoconductive semiconductor layer of each sub-package are differently doped, is the same transition metal in both the first and second photoconductive semiconductor layer.

In another preferred embodiment, in at least one sub-package, the first photoconductive semiconductor layer is doped with one transition metal and the second photoconductive semiconductor layer is doped with another transition metal.

It can also be advantageously provided that a photoconductive layer, preferably the first or the second semiconductor layer, of each sub-package is doped with a transition metal and one or the other photoconductive semiconductor layer of each sub-package is n-doped, p-doped or undoped.

It is also advantageous if at least one of the layers, preferably the first and/or the second photoconductive semiconductor layer, of each sub-package is doped with a dopant which is energetically in the region of the band center of the band gap of the semiconductor material of the respective layer, and has a deviation from the band center of a maximum of ±10% of the band gap energy of the band gap.

It is advantageous if light of a wavelength range between 0.5 μm and 2 μm is absorbed in at least one of the sub-packages.

An antenna for radiating and receiving terahertz radiation is preferably connected to the photoconductor.

The invention also relates to a method for producing a photoconductor, in which a layer package comprising a plurality of photoconductive semiconductor layers is applied indirectly or directly to a substrate. According to the invention, it is provided that a layer package comprising at least two sub-packages is applied to the substrate or to a buffer layer located on the substrate, each sub-package comprising at least one first photoconductive semiconductor layer and a second photoconductive semiconductor layer, wherein in each of the sub-packages the first and second photoconductive semiconductor layer are doped to different degrees.

With regard to the advantages of the method according to the invention and advantageous embodiments of the method according to the invention, reference is made to the above statements in connection with the photoconductor according to the invention and its advantageous embodiments.

Figure 2:
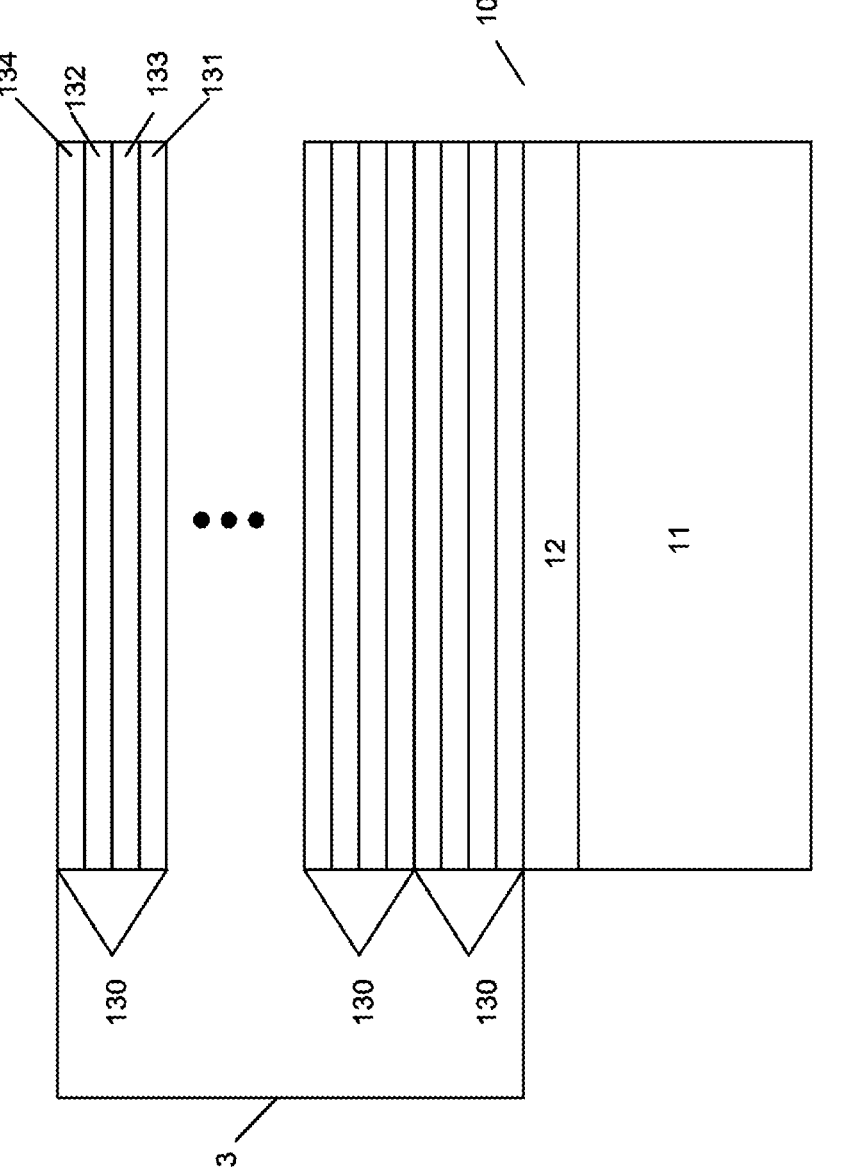
Figures 3, 4:
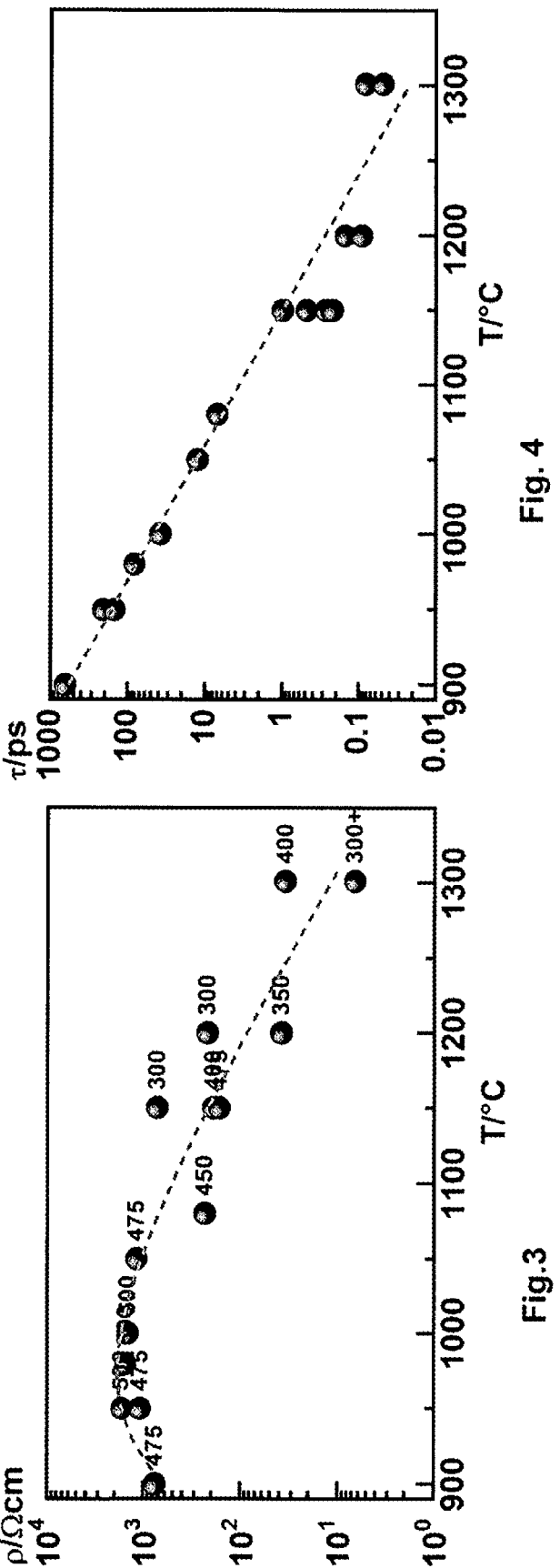
Figures 5, 6:
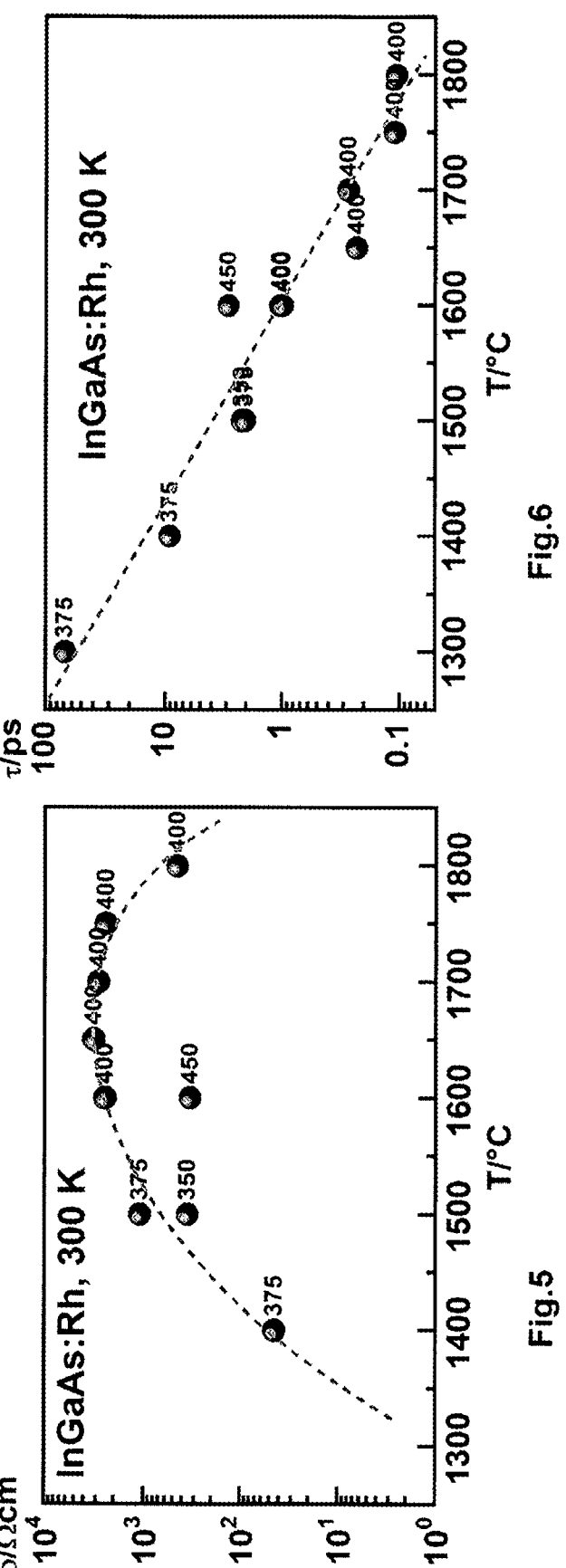

The invention is explained in more detail in the following by means of exemplary embodiments; in the drawing, by way of example, FIG. 1 shows a first exemplary embodiment of a photoconductor according to the invention, FIG. 2 shows a second exemplary embodiment of a photoconductor according to the invention, FIGS. 3-4 show curves of the resulting resistance and the resulting recombination rate for different growth temperatures in the case of iron doping of InGaAs material, and FIGS. 5-6 show curves of the resulting resistance and the resulting recombination rate for different growth temperatures in the case of rhodium doping of InGaAs material.

The same reference signs are used throughout the figures for identical or comparable components.

FIG. 1 shows a schematic cross-section of an exemplary embodiment of a photoconductor 10 according to the invention, which can form a component of a THz antenna, not shown in detail. The photoconductor 10 comprises a substrate 11 made of a preferably semi-insulating material, which may be, for example, InP material. A non-conductive buffer layer 12 is located on the substrate 11. On the non-conductive buffer layer 12, a layer package 13 comprising a plurality of sub-packages 130 has been deposited, preferably by means of molecular beam epitaxy (MBE).

In the exemplary embodiment according to FIG. 1, the sub-packages 130 each have a first photoconductive semiconductor layer 131 and a second photoconductive semiconductor layer 132. The semiconductor layers 131 and 132 preferably consist of InGaAs material.

The thickness of the two semiconductor layers 131 and 132 is relatively small and is preferably less than 10 nanometers. Such a thickness of the photoconductive semiconductor layers 131 and 132 is in the order of magnitude of the de-Broglie wavelength, so that the electron probability distribution in each of the sub-packages 130—viewed perpendicular to the layer plane of the semiconductor layers 131 and 132—extends at least over the first semiconductor layer 131 and the associated or adjacent second semiconductor layer 132.

The number of sub-packages 130 in the layer package 13 is preferably in a range between 20 and 100, which results in a total thickness of the layer package 13 preferably in the range between 500 nanometers and 2 microns.

The semiconductor layers 131 and 132 are designed differently and differ in terms of their concentration of dopants and in terms of the spatial distribution of the dopants within the respective layer. Due to the different design of the semiconductor layers 131 and 132 as well as the high number of sub-packages 130, the layer package 13 in the exemplary embodiment according to FIG. 1 forms a structure that is known in the technical jargon as a short period semiconductor superlattice (SPSL).

In the exemplary embodiment according to FIG. 1, the first photoconductive semiconductor layer 131 has a relatively high concentration of a dopant which is at least 10 times, preferably at least 100 times, higher than the dopant concentration in the second photoconductive semiconductor layer 132. As a dopant, the semiconductor layer 131 preferably uses a so-called transition metal, which can be, for example, iron, ruthenium, rhodium and/or iridium.

The inhomogeneous distribution of the dopants within the first semiconductor layer 131 is preferably chosen—for example by an appropriate control of the molecular beam epitaxy—large enough to cause clustering of dopant atoms within the crystal lattice and the formation of defects and recombination centers, thereby achieving a high recombination rate of charge carriers there or in the first semiconductor layer 131. However, the disadvantage is that the recombination centers can cause dark currents.

In contrast to the first semiconductor layer 131, the dopant concentration in the second semiconductor layer 132 is preferably relatively small; in addition—for example by an appropriate control of the molecular beam epitaxy—the dopants there are homogeneously distributed. Due to the low dopant concentration, the electrical resistance in the second semiconductor layer 132 will be relatively large, at least larger than in the first semiconductor layer 131, and the recombination rate remains low, at least lower than in the first semiconductor layer 131. Due to the high resistance of the second semiconductor layer 132, dark currents from the first semiconductor layer 131 can be compensated.

Due to the different design of the semiconductor layers 131 and 132, the layer properties can be individually optimized for specific physical effects. Thus, in the exemplary embodiment the first semiconductor layer 131, due to its high dopant concentration and the inhomogeneous distribution of the dopants, is intended or designed to provide crystal defects, which in turn serve as recombination centers for an ultra-fast hole-electron recombination.

The second semiconductor layer 132, by contrast, has a different function. Due to its low electrical conductivity and due to the homogeneous distribution of the dopants within the layer, it helps to keep dark currents at a low level or to compensate for background conductivity in an optimal way.

The different optimization directions within each sub-package 130 can be combined—without disadvantages for the photoconductive properties of the photoconductor 10—because due to the small thickness of the semiconductor layers in the range of the de-Broglie wavelength, the electron probability distribution extends over multiple layers of the sub-packages 130.

In each of the sub-packages 130 of the layer package 13, due to the combination of the different design of the semiconductor layers 131 and 132 contained in them, an optimization is achieved with respect to different or opposite physical effects, the following properties can be achieved:

an efficient conversion of incoming optical radiation or light into electron-hole pairs, a high electron mobility parallel to the layer planes of the semiconductor layers 131 and 132, a short lifetime of the electrons and a high resistance.

Following the molecular beam epitaxy of the layer package 130, this can be post-processed; for example, a mesa structure or rib structure can be etched into the layer package 130 for wave guiding, as is known, for example, from the German unexamined application document DE 102016 202 216 A1 mentioned above.

FIG. 2 shows a further exemplary embodiment of a photoconductor 10 according to the invention in a schematic cross-section. In the exemplary embodiment according to FIG. 2, each of the sub-packages 130 has four layers, namely a first photoconductive semiconductor layer 131, which can correspond to the first semiconductor layer 131 according to FIG. 1, a second photoconductive semiconductor layer 132, which can correspond to the second semiconductor layer 132 according to FIG. 1, and two additional, preferably lightly doped or undoped, semiconductor layers 133 and 134, each forming an intermediate layer between adjacent semiconductor layers 131 and 132. The function of the intermediate layers 133 is to prevent diffusion of dopants between the two semiconductor layers 131 and 132 and thus at least to delay aging of the photoconductive properties of the photoconductor 130.

In the exemplary embodiments which have been explained in connection with FIGS. 1 and 2, both the first semiconductor layer 131 and the second semiconductor layer 132 are each doped with a transition metal, the only differences being the dopant concentration in the two semiconductor layers and the local distribution of the dopants (with and without clustering), as explained above.

Transition metals have the advantage with regard to their use in photoconductors of being located energetically in the region of the band center of the band gap of the respective semiconductor material in which they are inserted, thereby allowing a particularly high efficiency to be achieved with regard to recombination of electrons and holes. It is particularly advantageous if the dopants, in particular transition metals, provided for the formation of recombination centers, are located in the region of the band center with a maximum deviation of ±10% of the band gap energy of the respective band gap.

Alternatively, it may be provided that at least one of the two semiconductor layers, preferably the second semiconductor layer 132, is doped with a different dopant, thereby achieving, for example, an n-doping or a p-doping.

FIGS. 3 to 6 show, for iron and rhodium respectively, the resulting specific resistance $\rho$ in $\Omega$cm and the recombination time $\tau$ in picoseconds for different Fe- and Rh-cell temperatures T in degrees Celsius C during gas-source molecular beam epitaxy of InGaAs material.

FIGS. 3 and 4 show that for iron, a very high resistance can be obtained at approximately 1000° C. (iron doping $0.9 \cdot 10^{19}$ cm$^{-3}$), whereas a cell temperature of 1300° C. is ideal for low recombination times (iron doping $1.7 \cdot 10^{22}$ cm$^{-3}$); a suitable compromise temperature would therefore be around 1150° C. (doping $0.6 \cdot 10^{21}$ cm$^{-3}$).

FIGS. 5 and 6 show that for rhodium, a very high resistance can be obtained at approximately 1650° C. (doping $7.9 \cdot 10^{19}$ cm$^{-3}$), whereas a temperature of 1800° C. is ideal for low recombination times (doping $4.9 \cdot 10^{20}$ cm$^{-3}$); a suitable compromise temperature here would be around 1700° C. (doping $1.1 \cdot 10^{20}$ cm$^{-3}$).

As the first semiconductor layer 131, which should have a high recombination rate, an iron-doped layer at approx. 1300° C. and a doping of $1.7 \cdot 10^{19}$ cm$^{-3}$ is therefore preferably produced for the sub-packages of the photoconductor 10 according to FIGS. 1 and 2; as the second semiconductor layer 132, which should have high resistance, a rhodium-doped layer at approx. 1650° C. and a doping of $7.9 \cdot 10^{19}$ cm$^{-3}$ is therefore preferably produced. In this case, the ratio of the doping concentrations is more than 200.

Although the invention has been illustrated and described in greater detail by means of preferred exemplary embodiment, the invention is not restricted by the examples disclosed and other variations can be derived therefrom by the person skilled in the art without departing from the scope of protection of the invention.

LIST OF REFERENCE SIGNS 10 photoconductor
11 substrate
12 non-conductive buffer layer
13 layer package
130 sub-package
131 first photoconductive semiconductor layer
132 second photoconductive semiconductor layer
133 lightly doped or undoped semiconductor layer
134 lightly doped or undoped semiconductor layer
C degrees Celsius
T cell temperatures
$\rho$ specific resistance
$\tau$ recombination time

The invention claimed is:

1. A photoconductor having a layer package comprising a plurality of photoconductive semiconductor layers, wherein the layer package comprises at least two sub-packages, each comprising at least one first photoconductive semiconductor layer and a second photoconductive semiconductor layer, wherein in each of the at least two sub-packages the at least one first photoconductive semiconductor layer and the second photoconductive semiconductor layer are doped to different degrees, wherein a dopant or dopants with which the first and second semiconductor layers are doped is or are iron, rhodium or ruthenium and wherein in each of the at least two sub-packages, due to the doping to the different degrees each of the at least one first photoconductive semiconductor layer has a greater recombination rate for electron-hole pairs than the second photoconductive semiconductor layer and in each of the at least two sub-packages, due to the doping to the different degrees, the second photoconductive semiconductor layer has a greater electrical resistance than the first photoconductive semiconductor layer.

2. The photoconductor as claimed in claim 1, wherein in each of the at least two sub-packages, the at least one first photoconductive semiconductor layer is doped at least 10 times higher than the second photoconductive semiconductor layer.

3. The photoconductor as claimed in claim 1, wherein the dopant, with which the at least one first photoconductive semiconductor layer and the second photoconductive semiconductor layer of each of the at least two sub-packages are differently doped, is a transition metal.

4. The photoconductor as claimed in claim 1, wherein in each of the at least two sub-packages the dopant in the at least one first photoconductive semiconductor layer forms a higher concentration of dopant clusters than in the second photoconductive semiconductor layer and the dopant distribution in the second photoconductive semiconductor layer is more homogeneous than in the at least one first photoconductive semiconductor layer.

5. The photoconductor as claimed in claim 1, wherein the thickness of each of the plurality of photoconductive semiconductor layers of each of the at least two sub-packages is less than 10 nm.

6. The photoconductor as claimed in claim 1, wherein a thickness of the layer package formed from the at least two sub-packages is in a range between 0.6 and 2 μm.

7. The photoconductor as claimed in claim 1, wherein the number of at least two sub-packages in the layer package is between 20 and 100.

8. The photoconductor as claimed in claim 1, wherein
a thickness of the at least one first photoconductive semiconductor layer and the second photoconductive semiconductor layers for each of the at least two sub-packages is on an order of magnitude of the de-Broglie wavelength of electrons located in a respective semiconductor layer and mobile in a respective layer plane, and a probability distribution of electrons in each of the at least two sub-packages—viewed perpendicular to the layer plane of the plurality of photoconductive semiconductor layers—extends at least over the at least one first semiconductor layer and the second semiconductor layer.

9. The photoconductor as claimed in claim 1, wherein in at least one of the at least two sub-packages or in all sub-packages, an intermediate layer is arranged between the at least one first photoconductive semiconductor layer and the second semiconductor layer, which slows down the diffusion of the dopant from the at least one first photoconductive semiconductor layer into the second semiconductor layer.

10. The photoconductor as claimed in claim 1, wherein the at least one first photoconductive semiconductor layer and the second semiconductor layer are each doped InGaAs layers.

11. The photoconductor as claimed in claim 1, wherein the dopant with which the at least one first photoconductive semiconductor layer and the second semiconductor layer are doped is iron.

12. The photoconductor as claimed in claim 1, wherein the dopant with which the at least one first photoconductive semiconductor layer and the second semiconductor layer are doped is rhodium.

13. The photoconductor as claimed in claim 1, wherein the dopant which the at least one first photoconductive semiconductor layer and the second semiconductor layer are doped is ruthenium.

14. The photoconductor as claimed in claim 1, wherein an antenna for radiating and receiving terahertz radiation is connected to the photoconductor.

15. The photoconductor as claimed in claim 1, wherein the at least one first photoconductive semiconductor layer and the second semiconductor layer are each molecular beam epitaxy-grown layers and/or the dopant, with which the at least one first photoconductive semiconductor layer and the second semiconductor layer of each of the at least two sub-packages are differently doped, is the same transition metal in both the at least one first photoconductive semiconductor layer and the second semiconductor layer and/or in at least one sub-package of the at least two subpackages, the first photoconductive semiconductor layer is doped with one transition metal and the second photoconductive semiconductor layer is doped with another transition metal and/or light of a wavelength range between 0.5 µm and 2 µm is absorbed in at least one of the sub-packages and/or a photoconductive layer, wherein the at least one first photoconductive semiconductor layer and the second semiconductor layer of each of the at least two sub-packages, is doped with a transition metal and one or the other photoconductive semiconductor layer of each of the at least two sub-packages is n-doped, p-doped or undoped and/or at least one of the at least one first photoconductive semiconductor layer and/or the second semiconductor layer of each of the at least two sub-packages, is doped with a dopant which is energetically in a region of the band center of the band gap of a semiconductor material of a respective layer, and has a deviation from a band center of a maximum of ±10% of a band gap energy of the band gap.

\* \* \* \* \*